Figure 1:
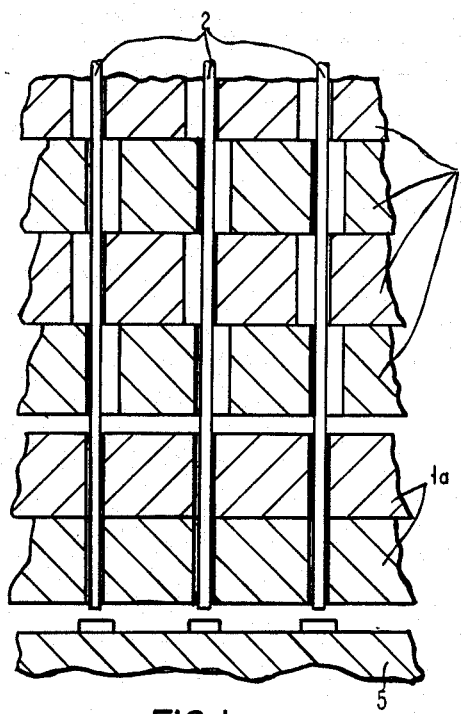

United States Patent [19]

Bayer et al.

[11] Patent Number: 4,843,315
[45] Date of Patent: Jun. 27, 1989

[54] CONTACT PROBE ARRANGEMENT FOR ELECTRICALLY CONNECTING A TEST SYSTEM TO THE CONTACT PADS OF A DEVICE TO BE TESTED

[75] Inventors: Thomas Bayer, Sindelfingen; Michael Elsasser, Herrenberg; Johann Greschner, Pliezhausen; Heinrich Schmid, Tiefenbronn; Roland Stöhr, Nufringen; Olaf Wolter, Schonaich; Jürgen Wittlinger, Böblingen, all of Fed. Rep. of Germany

[73] Assignee: International Business Machines Corporation, Armonk, N.Y.

[21] Appl. No.: 167,676

[22] Filed: Mar. 14, 1988

[30] Foreign Application Priority Data

Mar. 27, 1987 [EP] European Pat. Off. ........ 87104577.9

[51] Int. Cl.$^4$ ..................... G01R 1/073; G01R 1/067
[52] U.S. Cl. ............................ 324/158 P; 324/158 F; 324/73 PC; 324/72.5
[58] Field of Search ........... 324/158 F, 158 P, 73 PC, 324/72.5; 439/65, 66, 74, 81

[56] References Cited

U.S. PATENT DOCUMENTS

| | | | |
|---|---|---|---|
| 3,904,934 | 9/1975 | Martin | 439/66 |
| 3,941,442 | 3/1976 | Friend | 439/65 |
| 4,027,935 | 6/1977 | Byrnes et al. | 439/65 |
| 4,622,514 | 11/1986 | Lewis | 324/72.5 |

FOREIGN PATENT DOCUMENTS 0165331  6/1984  European Pat. Off. .
0164672  3/1985  European Pat. Off. .
0068270  6/1982  Fed. Rep. of Germany .
3337915  10/1982  Fed. Rep. of Germany .

Primary Examiner—Reinhard J. Eisenzopf
Assistant Examiner—Vinh P. Nguyen
Attorney, Agent, or Firm—John D. Crane

[57] ABSTRACT

The contact probe arrangement includes a stack of perforated plates (1, 1a) through which extend a plurality contact probes. The stack of perforated plates consists of two kinds of plates. The first kind forms the lowermost plates (1a). They have circular or square holes permitting a vertical placing of the contact probes onto the contact pads (4) of the device (5) to be tested. The plates (1) of the second kind have oblong, rectangular, square, circular, elliptical or trapezoidal holes (3). With respect to the stacked plates of the second kind, alternate ones are offset against the two other adjacent plates which are aligned relative to each other, in such a manner that each contact probe is surrounded by part of the lower edge of the upper of two adjacent perforated plates, and part of the upper edge of the lower of two adjacent perforated plates. If axial stress is applied, the contact probe can thus not buckle any farther than to a part of the perforation wall limiting its maximum buckling. This ensures a sufficiently low contact resistance between the contact probe and the contact pad of the device to be tested. By using a corresponding number of perforated plates of the second kind the contact probes can adapt to height differences of the contact pads caused by irregularities in the surface of the device to be tested.

10 Claims, 3 Drawing Sheets

CONTACT PROBE ARRANGEMENT FOR ELECTRICALLY CONNECTING A TEST SYSTEM TO THE CONTACT PADS OF A DEVICE TO BE TESTED

The invention relates to a contact probe arrangement for electrically connecting a test system to the circular contact pads on a device to be tested. The contact probes, in order to ensure a low contact resistance are pressed onto the contact pads causing the probes to buckle laterally in order to adapt to the height differences of the contact pads caused by irregularities of the surface of the device to be tested.

Such contact probe arrangements are used e.g. for testing conductor networks for failures and short-circuits, which networks extend on several levels in a ceramic substrate used in integrated circuits. European Pat. Application No. 84107154, Publ. No. 165331 (GE 984 006) describes a contact probe arrangement for electrically connecting a test system with the contact pads of a device to be tested, where wires of electrically highly conductive, resilient material are used as contact probes. These contact probes are placed onto the contact pads of the device to be tested and put under axial stress for achieving a low contact resistance, with the probes buckling laterally in this process. This lateral buckling is advantageous since it provides a means to adapt to the irregularities in the surface of the device to be tested. The buckling contact probes adapt to different heights of the contact pads.

The low contact resistance possible with the known arrangement at the points of contact between probes and pads of the device to be tested, as well as its adaptability with respect to height differences between the contact pads of the device to be tested substantially depends on the height and constancy of the axial probe load. The admissible axial load is limited by the material of the probes which is characterized by the hardness, the spring rigidity and the elasticity module as well as the ratio, called form factor, of the length of the vertical part of the contact probes relative to their diameter.

As progress in the production of monolithically integrated semiconductor circuits increases the density of the circuit elements realizable per unit of area, the diameter of the contact pads on the substrate become smaller, too. As a consequence, contact probes of a smaller diameter have to be used for testing the conductor networks in the substrates, i.e. the contact probes buckle more strongly in lateral direction under the same axial pressure, and their pressure load decreases at the expense of an increase of lateral buckling. Under these circumstances, however, the low pressure-dependent contact resistance necessary for reliable test results is no longer guaranteed.

The invention is to remedy these drawbacks. This invention as claimed achieves the object of providing a contact probe arrangement for electrically connecting a test system with the circular contact pads of a device to be tested, said arrangement, in spite of a reduced diameter of the contact probes ensuring the low contact resistance indispensable for reliable test results. All contact probes buckle in the same direction as they are guided through three perforated, widely spaced plates arranged one over the other. The middle one is slightly offset relative to the two others which are in precise alignment. In this manner, mutual contact among the contact probes under axial stress is prevented.

Figure 2:
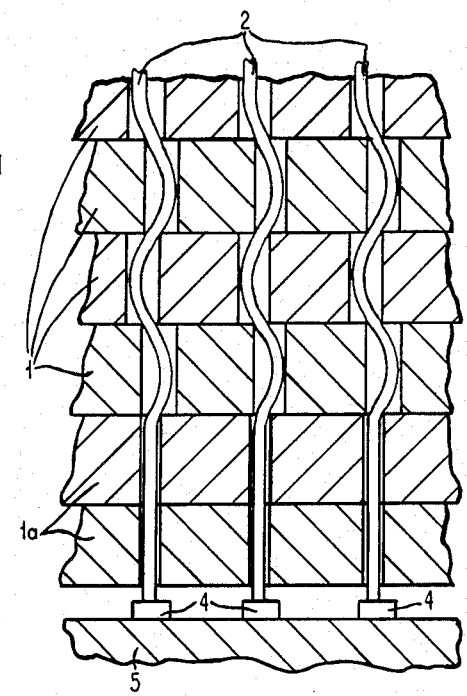
Figure 3:
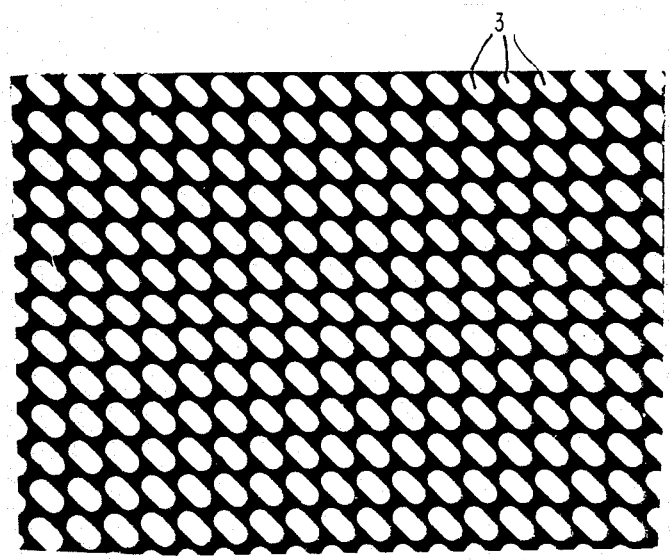
Figure 4:
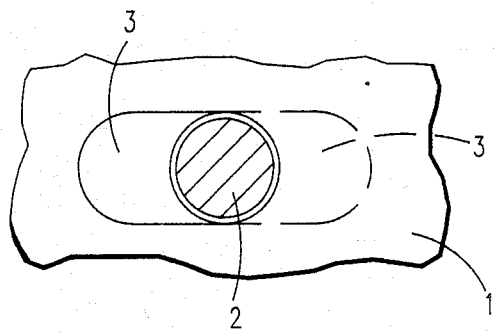
Figure 5:
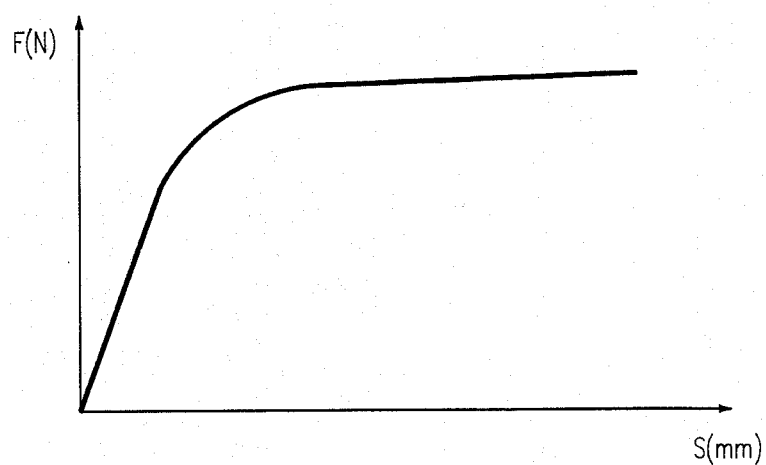

In the following the invention will be described in detail with reference to the drawings which form a part of the disclosure and depict the following:

FIG. 1 a longitudinal section through a segment of the lower part of the contact probe arrangement in accordance with the invention, in its stand-by mode, FIG. 2 a longitudinal section through a segment of the lower part of the contact probe arrangement according to the invention in its operating position, FIG. 3 an enlarged plan view of a segment of a plate with oblong perforations preferred as contact probe guide, FIG. 4 a plan view of two oblong holes of two perforated plates offset relative to each other, where the semi-circular edges of the oblong holes combine to form a circle surrounding a contact probe, FIG. 5 a force-distance diagram showing the relation between a pressure force acting on a contact probe and a shortening effected through the lateral buckling of the contact probe in the direction of its longitudinal axis not under load pressure.

Figure 6A:
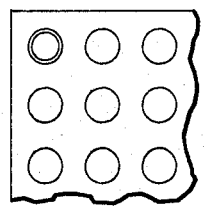
Figure 6B:
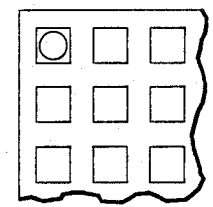
Figure 6C:
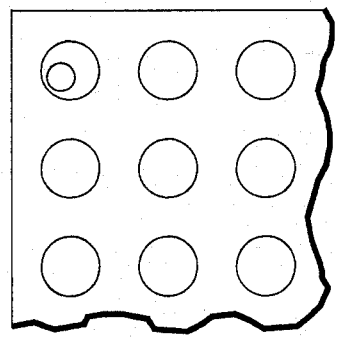
Figure 6D:
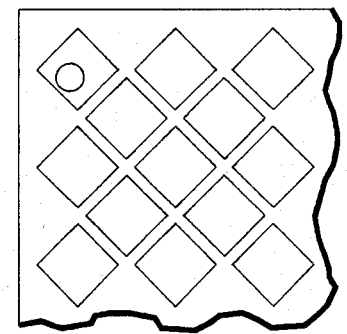
Figure 6E:
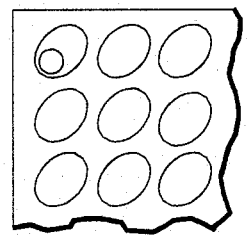
Figure 6F:
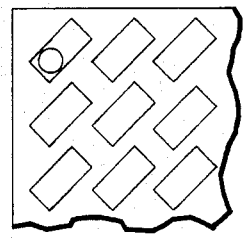
Figure 6G:
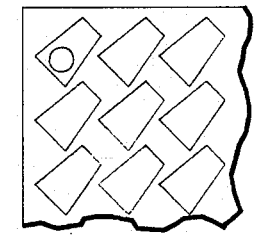

FIGS. 6A and 6B illustrate plates of a first kind with circular and square holes therethrough respectively;

FIGS. 6C, 6D, 6E, 6F and 6G respectively illustrate plates of a second kind having circular, square, eliptical, rectangular, and trapezoidal probe receiving holes therethrough.

As depicted in FIG. 1 which serves as the basic drawing, the new contact probe arrangement consists of a series of stacked perforated places 1 and 1a made preferably of an insulating material about 2 mm thick through which extend a plurality of contact probes 2. The perforated plates 1a are also called perforated plates of the first kind, and the perforated plates 1 those of the second kind. Perforated plates 1a arranged shiftably in vertical direction are pushed downward, in the stand-by mode, of the contact probe arrangement, by helical pressure springs (not shown) arranged between the top perforated plate 1a and the lowermost perforated plate 1, in the marginal zone of the perforated plates, so that the lower ends of contact probes 2 are protected by perforated plates 1a. While the perforated plates 1a have round or square guide holes for the contact probes, perforated plates 1 preferably have oblong holes 3, as shown by the plan view of FIG. 3. However, the perforated plates 1 can also have nothing but rectangular, or square, or circular, elliptical or trapezoidal holes.

The stacked perforated plates 1 and 1a are kept together by screw bolts not shown in FIG. 1. Perforated plates 1 are arranged in such a manner in the plate stack that of three respective stacked perforated plates 1, the middle one is offset relative to the two other plates which are aligned with each other, in such a manner that each contact probe 2 is surrounded by part of the lower edge of the upper perforation plate and part of the upper edge of the middle perforation plate, as well as by part of the lower edge of the middle perforation plate and part of the upper edge of the lower perforation plate. It is thus made sure that under an axial pressure the contact probe can buckle only to some extent with the perforation wall limiting its maximum buckling as illustrated in FIG. 2.

When the preferred perforated plates with oblong holes are used, two respective stacked oblong hole plates 1 are offset relative to each other in such a manner that the right-hand semicircle of oblong hole 3 of the upper perforated plate and the left-hand semicircle of oblong hole 3 of the lower perforated plate overlap.

Thus, under vertical pressure, contact probe 2 cannot buckle laterally in that plane which is determined by the semicircular lower edge of the upper plate 1, and the semicircular upper edge of the lower oblong hole plate 1. It cannot buckle, either, in the contact plane between the lower and the oblong hole plate 1 therebeneath which is aligned with the upper one. The lateral buckling of contact probes 1 is effected in the space between the upper and lower edge of an oblong hole 3. It is respectively limited by one of the two semi-circular hole walls of each oblong hole 3. Preferably, the longitudinal axis of each oblong hole is twice the diameter of the contact probes. With the above-mentioned other kind of hole shapes the long side of rectangular holes, the side length of square holes, the main axis of elliptical holes and the trapezoid height in trapezoidal holes have the size of twice the diameter of the contact probe.

During testing of a device, the contact probe arrangement is lowered onto contact pad 4 of the device 5 to be tested, as shown in FIG. 2. As soon as its lowermost, vertically shiftable perforated plate 1a contacts device 5 to be tested, it is moved upward against the helical pressure spring, and the lower ends of contact probes 2 are exposed for contacting contact pads 4. Further lowering of the contact probe arrangement with respect to the immovably arranged device 5 to be tested creates, through the thus caused pressure load on contact probes 2, the necessary low contact resistance between contact probes 2 and contact pads 4 of device 5 to be tested. Under the vertical pressure load on contact probes 2 the probes buckle laterally, as depicted in FIG. 2. The lateral buckling is strongest in the middle of the height of each perforated plate 1, and if oblong hole plates are used the buckling is limited by the one semicircular wall of an oblong hole 3 to such an extent that the low contact resistance between contact probes 2 and contact pads 4 of device 5 to be tested, as necessary for a reliable test results, can still be guaranteed.

To adapt the probes to the different heights of contact pads 4 caused by irregularities on device 5 to be tested, the number of stacked oblong hole plates 1 is such that the sum of all shortenings of a contact probe 2 in holes 3 in the direction of its original longitudinal axis due to lateral buckling suffices for an adaptation to the different heights.

Figure 7:
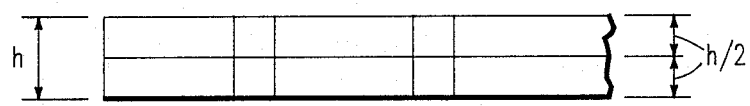

In the force-distance diagram of FIG. 5 which represents the relation between the force F acting on a contact probe 2 and the shortening caused by the lateral buckling of contact probe 2 in the direction of its longitudinal axis not under pressure load, the shallow part of the curve is particularly interesting. It shows to which differences in the height of contact pads 4 a contact probe 2 can adapt, with force F being substantially uniform. Tests have revealed that for the form of the respective curve the thickness of perforated plates 1 is of major importance. A plate thickness of 2 mm resulted in an optimum curve. Another way of arriving at the necessary plate thickness consists in structuring each perforated plate out of several part plates as illustrated in FIG. 7 where two plates, each having a thickness of h/2 are stacked together to create a stack having a thickness of h.

In order to be able to arrange as many contact probes as possible per unit of area, it is recommended to provide the longitudinal axes of oblong holes 3, or of the rectangular, elliptical and trapezoidal holes at an angle of 45° of 135°respectively, relative to the X-coordinate of the perforated plates.

Apart from the above-mentioned possible use of contact probes with a smaller diameter, the contact probe arrangement described here offers a number of further advantages. The adaptability of the contact probe arrangement to height differences among contact pads 4 of device 5 to be tested can be increased at discretion by increasing the number of perforated plates 1. Due to the perforated plate stack it is furthermore possible to exert greater pressure onto the contact probes. Finally, the threading of wire-shaped contact probes 2 through the perforated plate stack is considerably facilitated in that during threading perforated plates 1 are not offset relative to each other so that the entire hole size is available for the threading of contact probes 2. It is only after threading that perforated plates 1 are offset relative to each other, and fixed in this position by the screw bolts.

Contrary to the prior art test device mentioned in the introduction to the specification the contact probe arrangement of the invention, owing to its design structure is not exposed to considerable forces extending transversely to the axis of contact probes 2 which would have to be compensated by complex mechanical mounting systems. In the contact probe arrangement according to the invention, the existing transversal forces are respectively compensated within two perforated plates 1, since a contact probe 2 inserted e.g. in oblong hole 3 of upper perforated plate 1 buckles to the right, and to the left in the hole of the perforated plate therebeneath.

FIGS. 6A and 6B illustrate the embodiment of claim 3 herein and each figure illustrates a perforated plate respectively having a circular and a square hole therethrough having a size sufficiently large enough to receive a probe having a circular cross section. FIGS. 6C-6G illustrate plates of claim 4 having respectively circular, square, eliptical, rectangular and trapezoidal holes therethrough for receiving a probe of circular cross section.

While there has been shown and described what is considered at present to be the preferred embodiment of the present invention, it will be appreciated by those skilled in the art that modifications of such embodiment may be made. It is, therefore, desired that the invention not be limited to this embodiment, and it is intended to cover in the appended claims all such modifications as fall within the true spirit and scope of the invention.

What is claimed is:

1. Contact probe arrangement for electrically connecting a test system with contact pads on a device to be tested, the contact probes, for ensuring a low contact resistance, being pressed vertically onto the contact pads and buckling laterally in order to adapt to height differences of the contact pads caused by irregularities of the surface of the device to be tested, comprising, in combination:

a plurality of contact probes;

a plurality of stacked first perforated plates with said probes passing therethrough; the perforations of said first perforated plates are shaped and positioned to assure that one of said contact probes is positioned vertically in each perforation;

a plurality of stacked second perforated plates (1) with the perforation therethrough larger than the cross section of said probes and larger than the perforation in said first perforated plate with alternate second perforated plates being offset with respect to adjacent second perforated plates in such a manner that each said contact probe is maintained in a vertical attitude by part of the lower edge of the upper of two adjacent second perforated plates and part of the upper edge of the lower of two adjacent second perforated plates whereby application of axial pressure on said probes will cause said probes to buckle within the perforations in said second perforated plates at points between the surfaces of said second perforated plates.

2. Contact probe arrangement as claimed in claim 1, characterized in that all perforated plates of one kind are alike relative to each other.

3. Contact probe arrangement as claimed in claim 1, characterized in that the perforated plates of the first kind have circular or square holes, and that the diameter of the circular holes, or the side length of the square holes is only slightly greater than the diameter of the contact probe.

4. Contact probe arrangement as claimed in claim 1, characterized in that the perforated plates of the second kind have oblong holes or rectangular or square or circular or elliptical or trapezoidal holes, respectively.

5. The contact probe as claimed in claim 1 characterized in that each perforation in one said second perforated plate only partially overlies a perforation in an adjacent second perforation plate.

6. The contact probe as claimed in claim 5 wherein said perforations in said second perforated plates are elongated and the longitudinal axes of said elongated perforations in any second perforated plate are disposed at a 90° angle to the longitudinal axes of said elongated perforations on an adjacent second perforated plate.

7. The contact probe as claimed in claim 1 wherein the perforations through the second perforated plates have a longitudinal axis having a length at least twice the diameter of the contact probes.

8. Contact probe arrangement as claimed in claim 1, characterized in that each perforated plate is composed of a plurality of perforated part plates.

9. Contact probe arrangement as claimed in claim 1, characterized in that the perforated plate of the first kind is shiftable in vertical direction.

10. Contact probe arrangement as claimed in claim 1, characterized in that the thickness of the perforated plates is 2 mm.

* * * * *